United States Patent
Lee et al.

(10) Patent No.: US 8,254,140 B2
(45) Date of Patent: Aug. 28, 2012

(54) MOUNTING SUBSTRATE

(75) Inventors: Kwang-Yong Lee, Anyang-si (KR); Jong-Gi Lee, Yongin-si (KR); Sun-Won Kang, Seoul (KR); Ji-Seok Hong, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 623 days.

(21) Appl. No.: 12/357,693

(22) Filed: Jan. 22, 2009

(65) Prior Publication Data
US 2009/0188704 A1   Jul. 30, 2009

(30) Foreign Application Priority Data
Jan. 24, 2008   (KR) .................. 10-2008-0007345

(51) Int. Cl.
*H05K 7/10*   (2006.01)

(52) U.S. Cl. ........ 361/767; 174/259; 219/603; 219/616; 219/635

(58) Field of Classification Search ............ 361/760, 361/767, 768, 771; 174/255–257, 259, 260, 174/261, 263; 219/85.1, 85.12, 85.16, 85.2, 219/635, 603, 616, 618, 600
See application file for complete search history.

(56) References Cited

U.S. PATENT DOCUMENTS

| | | | | |
|---|---|---|---|---|
| 4,983,804 A * | 1/1991 | Chan et al. | ...................... | 219/616 |
| 5,010,233 A * | 4/1991 | Henschen et al. | ............. | 219/209 |
| 6,371,017 B1 * | 4/2002 | Yamazaki et al. | ............. | 101/129 |
| 2006/0084254 A1 * | 4/2006 | Attarwala | ...................... | 438/584 |
| 2007/0105341 A1 * | 5/2007 | Sosnowchik et al. | ......... | 438/455 |
| 2008/0264681 A1 * | 10/2008 | Iwai et al. | ...................... | 174/257 |

FOREIGN PATENT DOCUMENTS

| | | |
|---|---|---|
| JP | 08-293668 | 11/1996 |
| JP | 2001-044616 | 2/2001 |
| KR | 10-0517010 | 9/2005 |

* cited by examiner

*Primary Examiner* — Hoa C Nguyen
(74) *Attorney, Agent, or Firm* — Stanzione & Kim, LLP

(57) ABSTRACT

A mounting substrate includes a substrate, a bonding pad and an induction heating pad. The bonding pad is formed on the substrate, and adhered to a solder ball to mount a semiconductor chip on the substrate. The induction heating pad is disposed adjacent to the bonding pad, the induction heating pad being induction heated by an applied alternating magnetic field to reflow the solder ball. The induction heating pad having a diameter greater than a skin depth in response to the frequency of the applied alternating magnetic field is selectively induction heated in response to a low frequency band of the alternating magnetic field. Accordingly, during a reflow process for a solder ball, the semiconductor chip may be mounted on the mounting substrate to complete a semiconductor package without damaging the mounting substrate, to thereby improve the reliability of the completed semiconductor package.

17 Claims, 6 Drawing Sheets

MOUNTING SUBSTRATE

CROSS-REFERENCE TO RELATED APPLICATIONS

This application claims priority under 35 U.S.C. §119 to Korean Patent Application No. 2008-7345, filed on Jan. 24, 2008 in the Korean Intellectual Property Office (KIPO), the contents of which are herein incorporated by reference in their entirety.

BACKGROUND

1. Field of the Invention

Example embodiments relate to a mounting substrate and a method of manufacturing a semiconductor package using the same. More particularly, example embodiments relate to a mounting substrate to mount a semiconductor chip by applying an alternating magnetic field, and a method of manufacturing a semiconductor package having a semiconductor chip mounted on the mounting substrate.

2. Description of the Related Art

As the degrees of integration of semiconductor chips are increasing, a larger number of input/output (I/O) pins are required therein, and thus a ball grid array (BGA) package, which is a type of semiconductor package corresponding thereto, has been developed.

The BGA package using surface-mount technology (SMT) has been developed to have an increased number of I/O pins to increase a mounting density. That is, in the BGA package, an electrical signal is inputted and outputted between the semiconductor chip and an external printed circuit board (PCB) through a solder ball that is adhered to a surface of the semiconductor package, to thereby increase the number of the I/O pins capable of being accommodated in the semiconductor package.

Conventionally, after the solder ball is arranged on a bonding pad of a mounting substrate such as the PCB, and the semiconductor chip is aligned on the solder ball, the semiconductor chip is mounted on the mounting substrate by a reflow process or an infrared reflow process.

However, in the conventional reflow process, both the semiconductor chip and the mounting substrate with the solder ball are heated to a temperature higher than the melting point of the solder ball. Accordingly, a stress concentrates in the solder ball due to a difference of the thermal expansion coefficient between the mounting substrate and the semiconductor chip, to deteriorate the reliability of a product during an inspection process such as a temperature cycling (TC) test, a drop test, a bending test, etc. Further, the mounting substrate may be warped by heat in the reflow process, to cause an adhesion failure of the solder ball.

SUMMARY

Example embodiments provide a mounting substrate to mount a semiconductor chip and capable of preventing deterioration of reliability due to thermal deformation.

Example embodiments also provide a method of manufacturing a semiconductor package including a semiconductor chip mounted on the mounting substrate.

Additional aspects and utilities of the present general inventive concept will be set forth in part in the description which follows and, in part, will be obvious from the description, or may be learned by practice of the general inventive concept.

According to some example embodiments, a mounting substrate includes a substrate, a bonding pad and an induction heating pad. The bonding pad is formed on the substrate, and adhered to a solder ball to mount a semiconductor chip on the substrate. The induction heating pad is disposed adjacent to the bonding pad, the induction heating pad being induction heated by an applied alternating magnetic field to reflow the solder ball.

In an example embodiment, the induction heating pad may include a diameter greater than a skin depth in response to the frequency of the applied alternating magnetic field. The thickness of the induction heating pad may be less than the skin depth.

In an example embodiment, the induction heating pad may include copper.

In an example embodiment, the frequency of the applied alternating magnetic field may range from about 10 kHz to about 100 kHz. The diameter of the induction heating pad may range from about 700 µm to about 210 µm.

In another example embodiment, the induction heating pad may surround the bonding pad.

In still another example embodiment, the mounting substrate may further include a solder mask formed on the bonding pad to expose a portion of the bonding pad.

In still yet another example embodiment, the mounting substrate may further include a solder mask spaced apart from the bonding pad. The mounting substrate may further include an adhesion preventing pattern formed in a peripheral region of the bonding pad to prevent the solder ball from making contact with the solder mask after reflowing.

According to some example embodiments, in a method of manufacturing a semiconductor package, a bonding pad and an induction heating pad adjacent to the bonding pad are formed in a substrate. A solder ball is arranged on the bonding pad. A semiconductor chip is arranged on the solder ball. An alternating magnetic field is applied to the induction heating pad to reflow the solder ball using heat caused by induction heating.

In an example embodiment, reflowing the solder ball may include applying the alternating magnetic field having a frequency of from about 10 kHz to about 100 kHz to the induction heating pad.

In an example embodiment, the method may further include forming a solder mask on the bonding pad to expose a portion of the bonding pad, after forming the bonding pad and the induction heating pad in the substrate.

In another example embodiment, the method may further include forming a solder mask spaced apart from the bonding pad on the substrate, after forming the bonding pad and the induction heating pad in the substrate. The method may further include forming an adhesion preventing pattern in a peripheral region of the bonding pad to prevent the solder ball from making contact with the solder mask after reflowing.

In an example embodiment, the method may further include forming a molding member on the substrate to protect the semiconductor chip from external impacts.

According to some example embodiments, a mounting substrate includes an induction heating pad adjacent to a bonding pad and having a diameter greater than a skin depth in response to the frequency of an applied alternating magnetic field.

The induction heating pad is selectively induction heated in response to a low frequency band of the alternating magnetic field applied to the mounting substrate, and then heat caused by induction heating is transferred through the bonding pad to a solder, to thereby reflow a solder ball. Accordingly, during a reflow process for a solder ball, a semiconductor chip may be mounted on the mounting substrate to complete a semiconductor package without damaging the mounting substrate, to thereby improve the reliability of the completed semiconductor package.

According to some example embodiments, a mounting substrate includes a substrate, and a solder ball adhering member formed on the substrate to adhere to a solder ball to mount a semiconductor chip on the substrate, the solder ball adhering member including an induction heating region capable of being induction heated by an applied alternating magnetic field to reflow the solder ball.

In some embodiments, the induction heating region includes a different material than the remaining portions of the solder ball adhering member.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
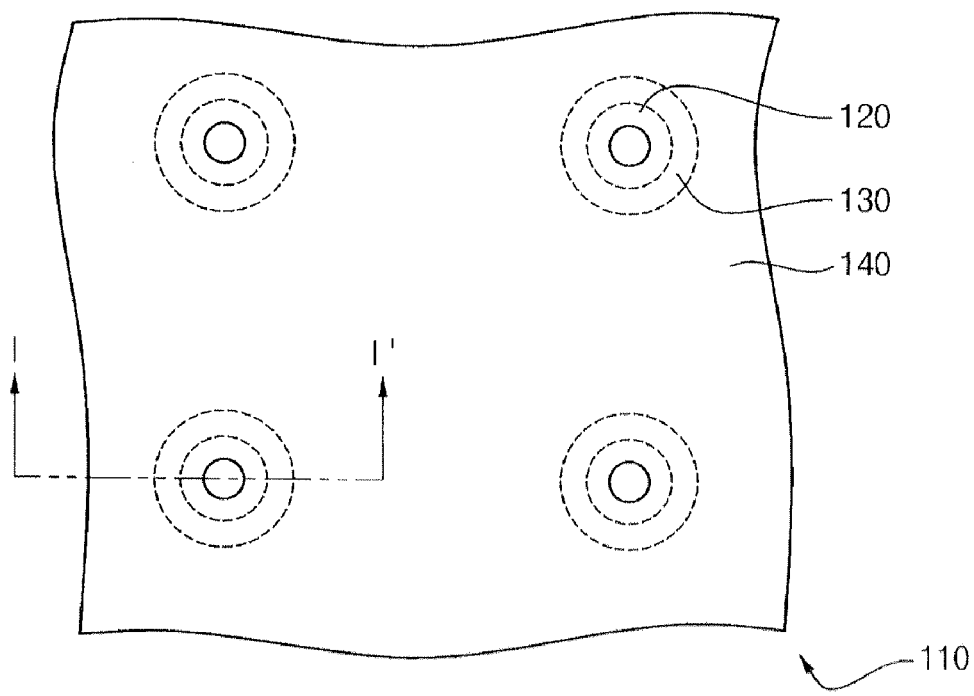
FIG. 1 is a plan view illustrating a mounting substrate in accordance with an example embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
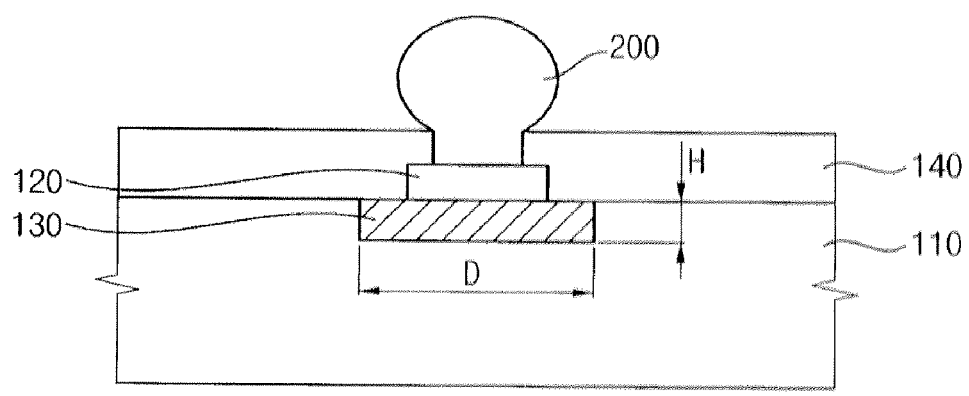
FIG. 2 is a cross-sectional view taken along a line I-I' in FIG. 1.

FIG. 1 is a plan view illustrating a mounting substrate in accordance with an example embodiment. FIG. 2 is a cross-sectional view taken along a line I-I' in FIG. 1.

Referring to FIGS. 1 and 2, a mounting substrate 100 according to the present example embodiment includes a substrate 110, a bonding pad 120 formed on the substrate 110 and an induction heating pad 130 arranged adjacent to the bonding pad 120.

For example, the substrate 110 may be a printed circuit board (PCB) where a semiconductor chip (not illustrated) is mounted via a solder ball 200. The substrate 110 may include a plurality of internal wirings (not illustrated) formed therein. The internal wiring may be electrically connected to the bonding pad 120.

A plurality of the bonding pads 120 may be formed on the substrate 110. The bonding pad 120 or pads may be connected to the solder ball 200 to mount the semiconductor chip. For example, the bonding pad may include a metal. Examples of metals that can be used may include gold (Au), copper (Cu), nickel (Ni), titanium (Ti), etc. These may be used alone or in a combination thereof.

In an example embodiment, the substrate 100 may further include a solder mask 140. The solder mask 140 may be formed on the bonding pad 120 of the substrate 100. The solder mask 140 may cover a peripheral portion of the bonding pad 120. Accordingly, the middle portion of the bonding pad 120 may be exposed by the solder mask 140. For example, the solder mask 140 may include an insulation material such as photo solder resist (PSR).

Accordingly, the peripheral portion of the bonding pad 120 may be supported by the solder mask 140. Therefore, the bonding pad 120 may be prevented from being lifting off due to external impacts.

The induction heating pad 130 is formed in the substrate 110. The induction heating pad 130 is arranged adjacent to the bonding pad 120. The induction heating pad 130 makes contact with the bonding pad 120 to transfer heat generated from the induction heating pad 130 to the bonding pad 120.

In order to mount the semiconductor chip on the mounting substrate 100, the solder ball 200 on the bonding pad 120 is reflowed to adhere to the bonding pad 120. In this case, an eddy current flow is caused to flow through the induction heating pad 130 by an applied alternating magnetic field so that the induction heating pad 130 is induction heated. The bonding pad 120 conducts heat generated in the induction heating pad 130 to the solder ball 200 so that the solder ball 200 is reflowed.

For example, the induction heating pad 130 may include a highly conductive material. Examples of the highly conductive material may include copper (Cu), aluminum (Al), iron (Fe), nickel (Ni), chromium (Cr), gold (Au), silver (Ag), platinum (Pt), etc. These may be used alone or in a combination thereof.

In some example embodiments, the induction heating pad 130 may have a diameter (D) greater than a skin depth ($\delta s$) in response to the frequency of the applied alternating magnetic field. The diameter (D) of the induction heating pad 130 may be larger than that of the bonding pad 120. The thickness (H) of the induction heating pad 130 may be less than the skin depth ($\delta s$) in response to the frequency of the applied alternating magnetic field.

As the frequency of an applied alternating signal is increased to be a high frequency, an eddy current as described above mainly flows through a surface of a material, as opposed to the inside thereof. This effect may be referred to as a skin effect, and the skin depth ($\delta s$) may be an index indicating how deep the eddy current flows from the surface of a material in response to the frequency of the alternating signal. The skin depth ($\delta s$) may depend on the conductivity of a material such as a metal pad and may be obtained by an Equation 1 as follows.

$$\delta s = \sqrt{\frac{2}{\omega \times \mu \times \gamma}} \quad \text{[Equation 1]}$$

Here, $\omega$ is a frequency, $\mu$ is a magnetic permeability and $\gamma$ is the conductivity of a material.

Figure 3:
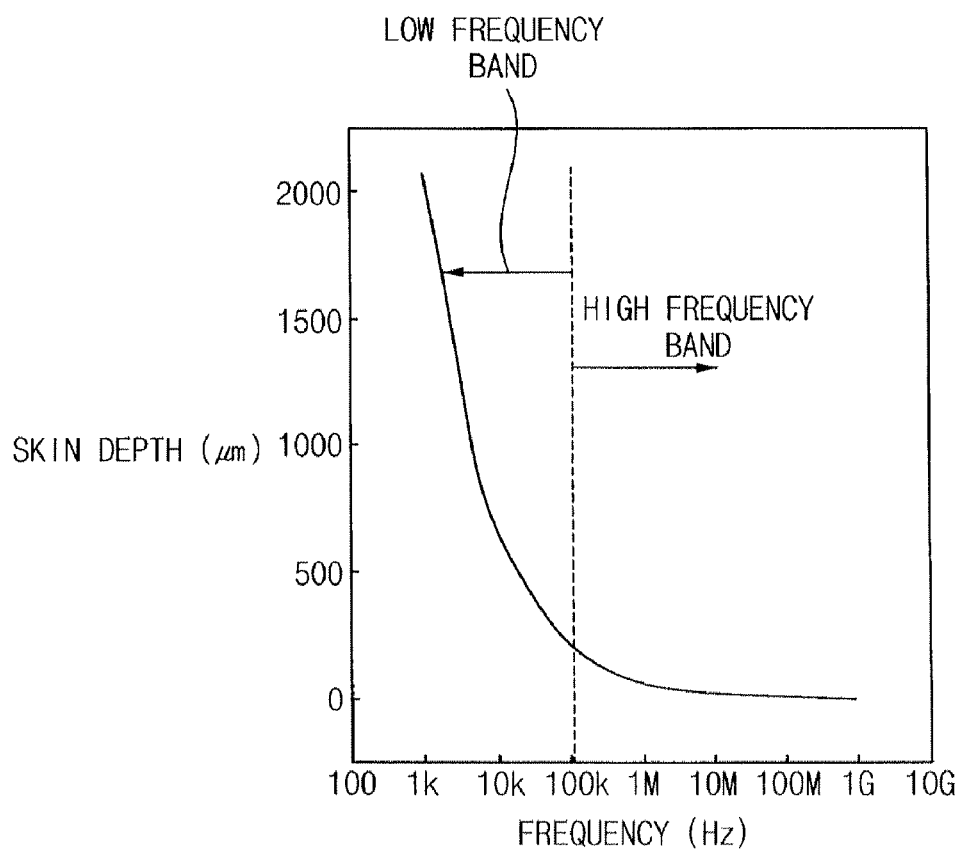
FIG. 3 is a graph illustrating a skin depth in response to the frequency of an applied alternating magnetic field.

FIG. 3 is a graph illustrating a skin depth in response to the frequency of an applied alternating magnetic field. In this case, FIG. 3 indicates the skin depth in response to the frequency of the alternating magnetic field when the alternating magnetic field is applied to the induction heating pad 130 including copper by a winding induction coil.

Table 1 below indicates a skin depth detected from a surface of the induction heating pad in response to the frequency of an alternating magnetic field applied to the induction heating pad. In Table 1, the induction heating pad includes copper.

TABLE 1

| Frequency (Hz) | Skin Depth (μm) |
|---|---|
| 10,000 | 656 |
| 50,000 | 293 |
| 100,000 | 208 |
| 500,000 | 93 |
| 1,000,000 | 66 |
| 5,000,000 | 29 |
| 10,000,000 | 20 |

Referring to FIG. 3 and Table 1, as the frequency of the applied alternating signal is increased to be a high frequency, the skin depth ($\delta s$) is decreased. As illustrated in FIG. 3 and Table 1, when the frequencies are respectively 10 kHz, 50 kHz, 100 kHz, 500 kHz, 1,000 kHz, the detected skin depths ($\delta s$) are respectively about 656 μm, 293 μm, 208 μm, 93 μm, 66 μm.

In some example embodiments, the diameter (D) of the induction heating pad 130 required to reflow the solder ball 200 may be greater than the skin depth ($\delta s$) in response to the applied frequency. For example, the diameter (D) of the induction heating pad 130 may range from about 700 μm to about 210 μm when the frequency is in a low frequency band of less than 100 kHz.

The minimum diameter of the induction heating pad 130 may be substantially the same as the skin depth ($\delta s$) in response to the applied frequency. However, it will be understood that the maximum diameter of the induction heating pad 130 may be adjusted corresponding to a distance between the adjacent bonding pads.

The current generated by the applied alternating signal mainly flows through the surface of the induction heating pad 130. Accordingly, the thickness (H) of the induction heating pad 130 may be adjusted to be the same as or less than the skin depth ($\delta s$) in response to the applied frequency.

In an example embodiment, the induction heating pad 130 may be positioned under the bonding pad 120. The solder mask 140 may be formed on the bonding pad 120 to expose a portion of the bonding pad 120.

If the alternating magnetic field having a specific frequency is applied to the mounting substrate 100, the induction heating pad 130 having the diameter (D) greater than the skin depth ($\delta s$) in response to the specific frequency is induction heated. Because the substrate 110 includes a nonconductor of electricity having a high specific resistance, most of heat caused by the induction heating is transferred to the solder ball 200 on the bonding pad 120 through the bonding pad 120, to thereby reflow the solder ball 200. Accordingly, most of heat that is selectively generated from only the induction heating pad 130 is transferred to the solder ball 200 through the bonding pad 120, thereby preventing deformation and warping of the substrate 110.

Figure 4:
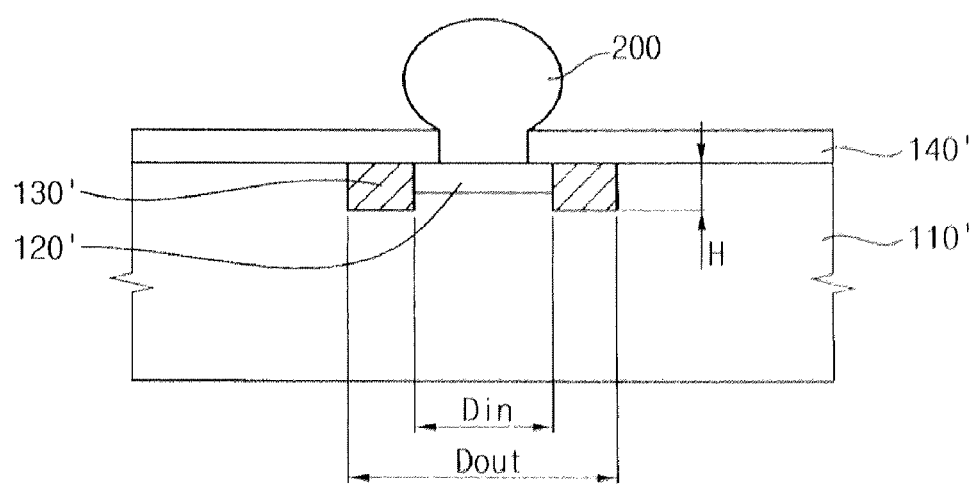
FIG. 4 is a cross-sectional view illustrating a mounting substrate in accordance with another example embodiment.

FIG. 4 is a cross-sectional view illustrating a mounting substrate in accordance with another example embodiment. The mounting substrate this embodiment can be substantially the same as in the embodiment of FIG. 2, except for an arrangement and shape of an induction heating pad. Thus, the same reference numerals will be used to refer to the same or like parts as those described in the previous embodiment, and any further repetitive explanation concerning the above elements will be omitted.

In the example embodiment of FIG. 4, an induction heating pad 130' of a mounting substrate 101 may be arranged to surround a bonding pad 120'. For example, the induction heating pad 130' may have a ring shape along a peripheral portion of the bonding pad 120'. Accordingly, the induction heating pad 130' may have a closed-loop shape. If the alternating magnetic field is applied in a direction perpendicular to the induction heating pad 130', an eddy current flows through the closed loop of the induction heating pad 130' to cause induction heating.

In this case, an inner diameter (Din) and an outer diameter (Dout) of the ring-shaped induction heating pad 130' may be determined to be greater than the skin depth (δs) in response to the applied frequency, and the thickness (H) of the induction heating pad 130' may be substantially the same as or less than the skin depth (δs) in response to the applied frequency.

Figure 5:
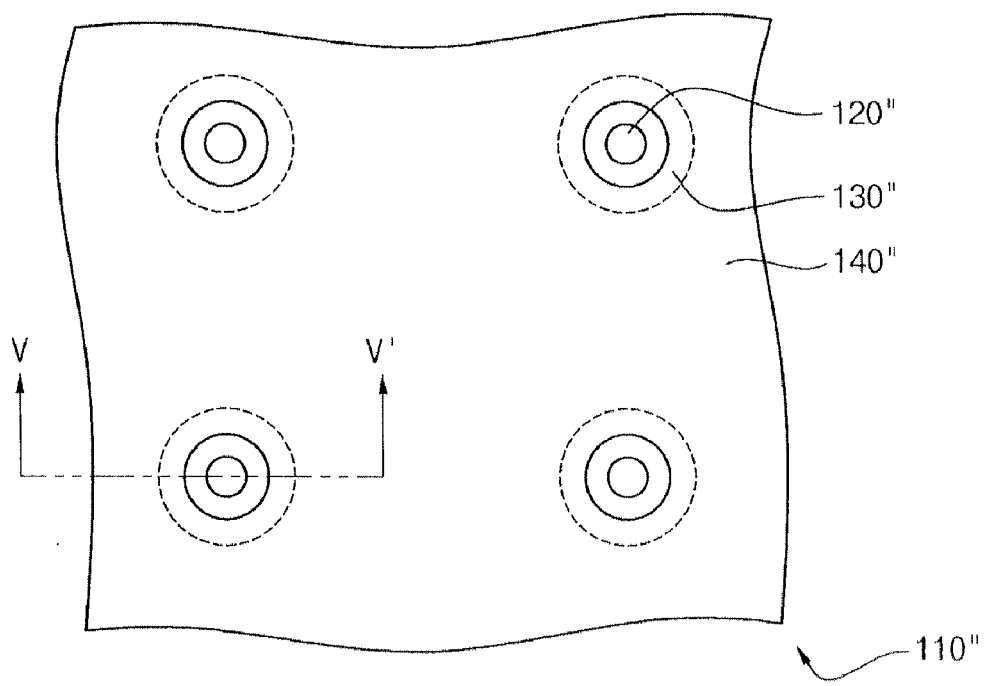
FIG. 5 is a plan view illustrating a mounting substrate in accordance with yet another example embodiment.
Figure 6:
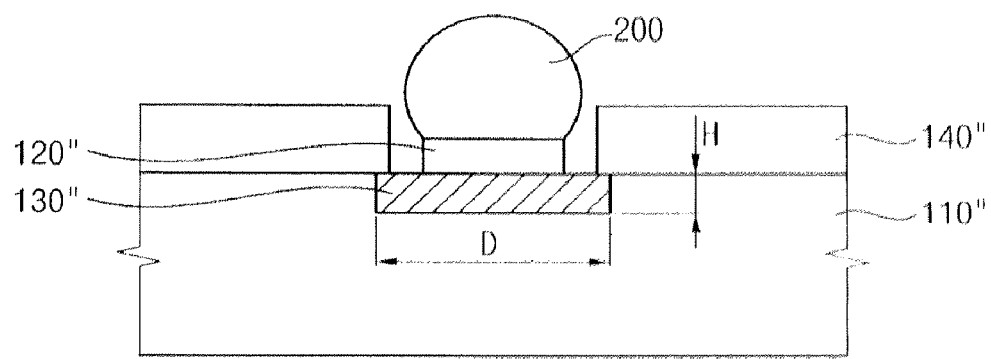
FIG. 6 is a cross-sectional view illustrating a line V-V' in FIG. 5.

FIG. 5 is a plan view illustrating a mounting substrate in accordance with still another example embodiment. FIG. 6 is a cross-sectional view illustrating a line V-V' in FIG. 5. The mounting substrate of the present embodiment can be substantially the same as in Embodiment I of FIG. 2 except for an arrangement of a solder mask. Thus, the same reference numerals will be used to refer to the same or like parts as those described in the embodiment of FIG. 1, and any further repetitive explanation concerning the above elements will be omitted.

Referring to FIGS. 5 and 6, a mounting substrate 102 according to this example embodiment includes a substrate 110", a bonding pad 120" formed on the substrate 110", an induction heating pad 130" arranged adjacent to the bonding pad 120" and a solder mask 140'.

The induction heating pad 130" is formed on the substrate 110". The induction heating pad 130" is arranged adjacent to the bonding pad 120". The bonding pad is formed on the induction heating pad 130". The induction heating pad 130" makes contact with the bonding pad 120 to transfer heat generated from the induction heating pad 130" to the bonding pad 120".

The solder mask 140" is formed on the substrate 110". The solder mask 140" is spaced apart from the bonding pad 120". The bonding pad 120" may not be covered by the solder mask 140". The bonding pad 120" is adhered to the solder ball 200. Accordingly, an adhesion area between the bonding pad 120" and the solder ball 200 may be increased and interfacial adhesion reliability between the solder ball 200 and the bonding pad 120" may be improved.

Figure 7:
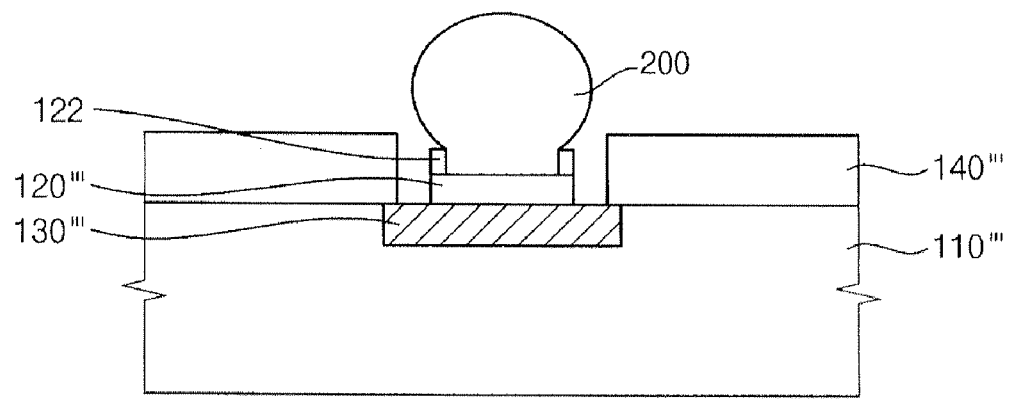
FIG. 7 is a cross-sectional view illustrating a mounting substrate in accordance with still another example embodiment.

FIG. 7 is a cross-sectional view illustrating a mounting substrate in accordance with still another example embodiment.

In this example embodiment, as illustrated in FIG. 7, an adhesion preventing pattern 122 may be formed in a peripheral region of a bonding pad 120'''. The adhesion preventing pattern 122 may be formed to extend upwardly from the peripheral region of the bonding pad 120'''. For example, the adhesion preventing pattern 122 may have a ring shape. Accordingly, the adhesion preventing pattern 122 may prevent the solder ball 200 from making contact with a solder mask 140''' after reflowing.

Hereinafter, a method of manufacturing a semiconductor package including a semiconductor chip mounted on the mounting substrate in FIG. 1 will be described.

FIGS. 8 to 11 are cross-sectional views illustrating a method of manufacturing a semiconductor package in accordance with some example embodiments.

Figure 8:
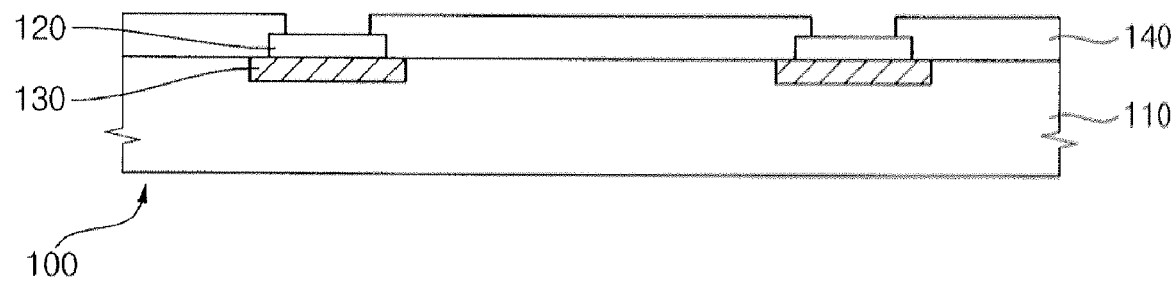
FIGS. 8 to 11 are cross-sectional views illustrating a method of manufacturing a semiconductor package in accordance with some example embodiments.

Referring to FIG. 8, a bonding pad 120 and an induction heating pad 130 adjacent to the bonding pad 120 are formed on a substrate 110. The bonding pad 120 and the induction heating pad 130 may be formed on the substrate 110 including a plurality of internal wirings (not illustrated) formed therein.

In an example embodiment, first, a thermal conductive material to be induction heated by an applied alternating magnetic field is coated on the substrate 110 such as a PCB, and then is patterned to form an induction heating pad 130.

For example, the induction heating pad 130 may be formed by a deposition process, a sputtering process, a plating process, a screen printing process, etc. Examples of the high thermal conductive material may be copper (Cu), aluminum (Al), iron (Fe), nickel (Ni), chromium (Cr), gold (Au), silver (Ag), platinum (Pt), etc. These may be used alone or in a combination thereof.

In some example embodiments, the induction heating pad 130 may have a diameter (D) greater than a skin depth (δs) in response to the frequency of the applied alternating magnetic field. The diameter (D) of the induction heating pad 130 may be larger than that of the bonding pad 120. The thickness (H) of the induction heating pad 130 may be less than the skin depth (δs) in response to the frequency of the applied alternating magnetic field.

The diameter (D) and the thickness (H) of the induction heating pad 130 may be determined based on a frequency of the alternating magnetic field to be applied. As the frequency is increased to a high frequency, the skin depth (δs) is decreased, and thus the diameter (D) of the induction heating pad 130 may be determined to be decreased. On the contrary, as the frequency is decreased to a low frequency, the skin depth (δs) is increased, and thus the diameter (D) of the induction heating pad 130 may be determined to be increased.

For example, when the alternating magnetic field is applied to the induction heating pad 130 including copper by a winding induction coil and the frequencies are respectively 10 kHz, 50 kHz, 100 kHz, 500 kHz, 1,000 kHz, the skin depths (δs) are respectively about 656 μm, 293 μm, 208 μm, 93 μm, 66 μm. Accordingly, the minimum diameter of the induction heating pad 130 may be substantially the same as the skin depth (δs) in response to the applied frequency. However, it will be understood that the maximum diameter of the induction heating pad 130 may also be adjusted corresponding to a distance between the adjacent bonding pads.

Then, after a bonding pad 120 is formed on the induction heating pad 130 to be connected to the internal wiring of the substrate 110, a solder mask 140 is formed on the bonding pad 120 to expose a portion of the bonding pad 120 to thereby complete the mounting substrate 100.

For example, the mounting substrate 100 may include a solder mask defined (SMD) type bonding pad where the solder mask 140 covers the peripheral region of the bonding pad 120 such that the middle portion of the bonding pad 120 is exposed. Alternatively, the mounting substrate 100 may include a non-solder mask defined (NSMD) type bonding pad where the bonding pad 120 is not covered by the solder mask to be adhered to a solder ball 200.

Figure 9:
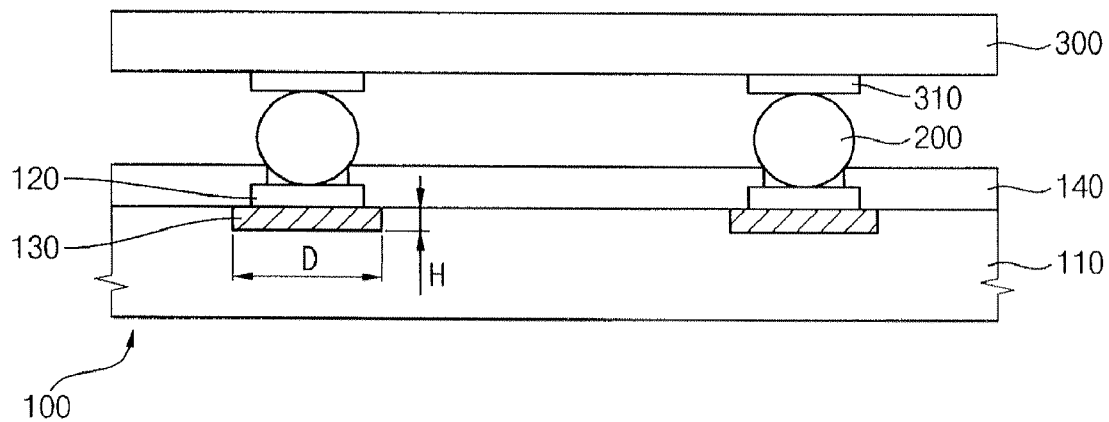

Referring to FIG. 9, after the solder ball 200 is arranged on the bonding pad 120 of the mounting substrate 100, a semiconductor chip 300 is arranged on the solder ball 200.

In an example embodiment, a liquefied paste may be coated on the bonding pad 120, and then the solder ball 200 may be aligned to be arranged on the bonding pad 120. For example, the paste may include resin, a solder powder or the like, or a combination thereof. The solder ball 200 may include tin (Sn), lead (Pb), indium (In), silver (Ag), copper (Cu), etc. These may be used alone or in a combination thereof.

In another example embodiment, the solder ball 200 may be adhered to a bonding pad 310 of the semiconductor chip 300, and then the semiconductor chip 300 may be disposed on the mounting substrate 100 to interpose the solder ball 200 between the mounting substrate 100 and the semiconductor chip 300.

Figure 10:
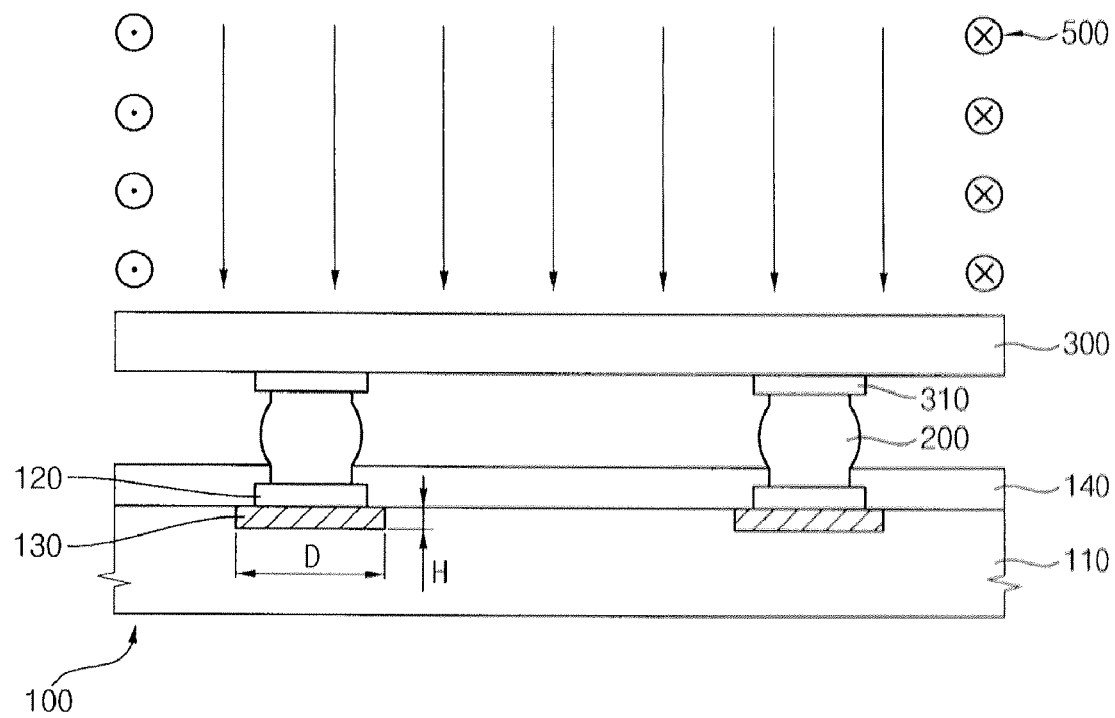

Referring to FIG. 10, an alternating magnetic field is applied to the induction heating pad 130 to thereby reflow the solder ball 200 using heat caused by induction heating.

In an example embodiment, a winding induction coil 500 is arranged to apply an alternating magnetic field $\vec{F_M}$ to the mounting substrate 100. If an alternating current flows through the induction coil 500, an alternating magnetic field is generated at the induction coil 500 and the alternating magnetic field is applied to the induction heating pad 130 of the mounting substrate 100.

For example, the frequency of the alternating magnetic field may be in a low frequency band in consideration of avoiding dielectric heating and reducing manufacturing costs. In an example embodiment, the frequency of the alternating magnetic field may range from about 10 kHz to about 100 kHz.

In some example embodiments, the induction heating pad 130 may have the diameter (D) greater than the skin depth (δs) in response to the applied frequency. The thickness (H) of the induction heating pad 130 may be less than the skin depth (δs) in response to the applied frequency.

By an induced electromotive force caused by the applied alternating magnetic field, an eddy current flows through the induction heating pad 130 to generate joule heat therein. On the other hand, because the diameter of the solder ball is much less than the minimum diameter needed to be induction heated in response to the specific frequency of the applied alternating magnetic field, the solder ball 200 may not be induction heated by the applied alternating magnetic field.

Heat generated in the induction heating pad 130 of the mounting substrate 100 is transferred through the bonding pad 120 to the solder ball 200 so that the solder ball 200 is reflowed to be adhered to the bonding pad 120. Most of heat that is selectively generated in only the induction heating pad 130 is transferred to the solder ball 200 through the bonding pad 120, thereby preventing damage to the mounting substrate 100.

The induction heating pad 130 of the mounting substrate 100 may be easily induction heated in response to the low frequency band, and further only the induction heating pad 130 may be selectively induction heated in the mounting substrate 100. Therefore, a time for a reflow process may be reduced to increase productivity.

Figure 11:
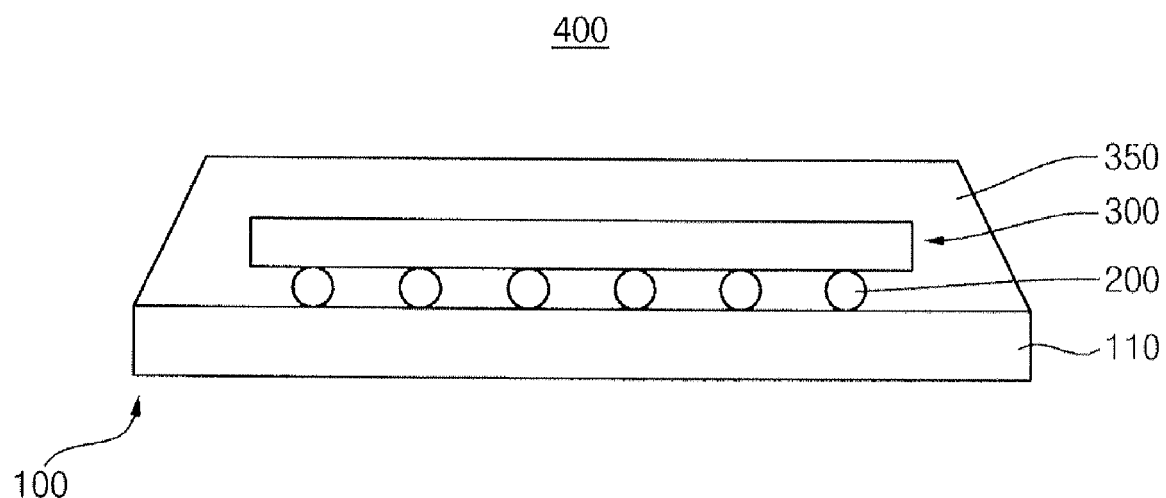

Referring to FIG. 11, a molding member 350 is formed on the substrate 110 to complete a semiconductor package 400. The molding member 350 can protect the semiconductor chip 300 from external impacts. For example, the molding member 350 may include an epoxy molding compound (EMC).

As mentioned above, according to some example embodiments, a mounting substrate includes an induction heating pad adjacent to a bonding pad and having a diameter greater than a skin depth in response to the frequency of an applied alternating magnetic field.

The induction heating pad is selectively induction heated in response to a low frequency band of the alternating magnetic field applied to the mounting substrate, and then heat caused by the induction heating is transferred through the bonding pad to a solder ball, to thereby reflow the solder ball. Accordingly, during a reflow process for a solder ball, a semiconductor chip may be mounted on the mounting substrate to complete a semiconductor package without damaging the mounting substrate, to thereby improve the reliability of the completed semiconductor package.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents

What is claimed is:

1. A mounting substrate, comprising:
   a substrate;
   a bonding pad formed on the substrate and adhered to a solder ball to mount a semiconductor chip on the substrate; and
   an induction heating pad adjacent to the bonding pad, the induction heating pad being induction heated by an applied alternating magnetic field to reflow the solder ball, the induction heating pad corresponding to the bonding pad in a one-to-one relation, and the induction heating pad directly contacting the bonding pad.

2. The mounting substrate of claim 1, wherein the induction heating pad comprises a diameter greater than a skin depth determined by the frequency of the applied alternating magnetic field.

3. The mounting substrate of claim 2, wherein the thickness of the induction heating pad is less than the skin depth.

4. The mounting substrate of claim 1, wherein the induction heating pad comprises copper.

5. The mounting substrate of claim 1, wherein the frequency of the applied alternating magnetic field ranges from about 10 kHz to about 100 kHz.

6. The mounting substrate of claim 5, wherein the diameter of the induction heating pad ranges from about 700 μm to about 210 μm.

7. The mounting substrate of claim 1, wherein the induction heating pad surrounds the bonding pad.

8. The mounting substrate of claim 1, further comprising:
   a solder mask formed on the bonding pad to expose a portion of the bonding pad.

9. The mounting substrate of claim 1, further comprising:
   a solder mask spaced apart from the bonding pad.

10. The mounting substrate of claim 9, further comprising:
    an adhesion preventing pattern formed in a peripheral region of the bonding pad to prevent the solder ball from making contact with the solder mask after reflowing.

11. A mounting substrate, comprising:
    a substrate; and
    a solder ball adhering member formed on the substrate to adhere to a solder ball to mount a semiconductor chip on the substrate, the solder ball adhering member including an induction heating region capable of being induction heated by an applied alternating magnetic field to reflow the solder ball, the induction heating region corresponding to the solder ball adhering member in a one-to-one relation, and the induction heating pad directly contacting the bonding pad.

12. The mounting substrate of claim 11, wherein the induction heating region includes a different material than the remaining portions of the solder ball adhering member.

13. The mounting substrate of claim 12, wherein the induction heating region includes a highly conductive material while the remaining portions of the solder ball adhering member is not highly conductive.

14. The mounting substrate of claim 12, wherein the induction heating region of the solder ball adhering member is disposed below the remaining portions thereof and has a larger diameter than a diameter of the remaining portions thereof.

15. The mounting substrate of claim 12, wherein the induction heating region of the solder ball adhering member has a thickness less than a skin depth caused by a frequency of an applied alternating magnetic field.

16. The mounting substrate of claim 12, wherein the induction heating region of the solder ball adhering member has a diameter greater than a skin depth caused by a frequency of an applied alternating magnetic field.

17. A mounting substrate, comprising:
a substrate;
bonding pads formed on the substrate and adhered to respective solder balls to mount at least one semiconductor chip on the substrate; and
induction heating pads respectively adjacent to the bonding pads, the induction heating pads being induction heated by an applied alternating magnetic field to reflow the solder balls, and the induction heating pads corresponding to the bonding pads in a one-to-one relation, and the induction heating pad directly contacting the bonding pad.

* * * * *